United States Patent
Ling et al.

(10) Patent No.: US 10,627,937 B2
(45) Date of Patent: Apr. 21, 2020

(54) DISPLAY MODULE

(71) Applicant: Shanghai Oxi Technology Co., Ltd, Shanghai (CN)

(72) Inventors: Yan Ling, Shanghai (CN); Hong Zhu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 140 days.

(21) Appl. No.: 15/737,897

(22) PCT Filed: Aug. 5, 2016

(86) PCT No.: PCT/CN2016/093568
§ 371 (c)(1),
(2) Date: Dec. 19, 2017

(87) PCT Pub. No.: WO2018/023722
PCT Pub. Date: Feb. 8, 2018

(65) Prior Publication Data
US 2019/0286869 A1   Sep. 19, 2019

(51) Int. Cl.
*G06F 3/041* (2006.01)
*G06F 3/042* (2006.01)
(Continued)

(52) U.S. Cl.
CPC ............ *G06F 3/0412* (2013.01); *G06F 3/042* (2013.01); *G06F 3/0421* (2013.01); *G06K 9/00* (2013.01);
(Continued)

(58) Field of Classification Search
CPC ............ G06K 9/0004; G06K 9/00053; G06F 2203/0338; G06F 21/32; G06F 3/0421;
(Continued)

(56) References Cited

U.S. PATENT DOCUMENTS 5,446,290 A * 8/1995 Fujieda ............... G06K 7/14
250/227.11
2004/0252867 A1* 12/2004 Lan .................. G06K 9/0004
382/124
(Continued)

FOREIGN PATENT DOCUMENTS

CN    104318205 A    1/2015
CN    105047689 A    11/2015
(Continued)

OTHER PUBLICATIONS

International Search Report and Written Opinion from PCT/CN2016/093568, dated Aug. 5, 2016 (with English Translation of Written Opinion).

*Primary Examiner* — Sanjiv D. Patel
(74) *Attorney, Agent, or Firm* — Adsero IP (57) ABSTRACT

A display module is provided, which includes: a first substrate and a second substrate disposed face to face, where the first substrate is a non-opaque substrate; a self-luminous display layer disposed between the first substrate and the second substrate, an optical fingerprint sensing layer disposed between the self-luminous display layer and the second substrate, where the optical fingerprint sensing layer has a photosensitive pixel region; the self-luminous display layer has a non-opaque region, at least a portion of light transmitting from the first substrate to the self-luminous display layer can pass through the self-luminous display layer and reach the optical fingerprint sensing layer; and the self-luminous display layer has a light-blocked region located between the self-luminous layer and the optical fingerprint sensing layer which is configured to prevent light emitting from the self-luminous layer from reaching the optical fingerprint sensing layer before entering the first substrate.

17 Claims, 6 Drawing Sheets

(51) Int. Cl.
*G06K 9/00* (2006.01)
*H01L 27/32* (2006.01)

(52) U.S. Cl.
CPC .......... *G06K 9/0004* (2013.01); *H01L 27/323* (2013.01); *H01L 27/3234* (2013.01); *G06F 2203/0338* (2013.01)

(58) Field of Classification Search
CPC .............. A61B 5/1172; H01L 27/3231; H01L 27/3244; G09G 3/0412; G09G 3/042
See application file for complete search history.

(56) References Cited

U.S. PATENT DOCUMENTS

| | | | |
|---|---|---|---|
| 2006/0033452 A1* | 2/2006 | Yamazaki | G09G 3/3258 315/291 |
| 2012/0169669 A1* | 7/2012 | Lee | H04N 5/2254 345/175 |
| 2014/0355846 A1* | 12/2014 | Lee | G06K 9/0004 382/124 |
| 2016/0092717 A1* | 3/2016 | Ling | G06K 9/0004 382/125 |
| 2017/0032167 A1* | 2/2017 | Chen | H01L 27/3227 |
| 2017/0084668 A1* | 3/2017 | Wang | H01L 27/32 |
| 2017/0220840 A1* | 8/2017 | Wickboldt | G06K 9/0053 |
| 2017/0220844 A1* | 8/2017 | Jones | G06K 9/0053 |

FOREIGN PATENT DOCUMENTS

| | | |
|---|---|---|
| CN | 105095877 A | 11/2015 |
| CN | 105550664 A | 5/2016 |
| KR | 20160043217 A | 4/2016 |
| WO | WO 2015/005959 A1 | 1/2015 |
| WO | WO 2017/024849 A1 | 2/2017 |
| WO | WO 2017/024850 A1 | 2/2017 |

* cited by examiner

DISPLAY MODULE

CROSS-REFERENCE TO RELATED APPLICATIONS

The present application is the national phase of International Application No. PCT/CN2016/093568, filed on Aug. 5, 2016, and entitled "DISPLAY MODULE", and the entire disclosure of which is incorporated herein by reference.

TECHNICAL FIELD

The present disclosure relates to photoelectric display field, and more particularly to a display module.

BACKGROUND

The display module generally includes substrates disposed facing to each other and a display layer disposed between the substrates for displaying output information of an electronic product. In the existing display module applied to mobile terminals such as mobile phones and so on, a touch sensing layer is generally integrated.

The self-luminous display layer in existing display modules is an important development trend among all kinds of display layers, due to advantages of the self-luminous display layer like no need of backlight, light in weight and power saving and so on.

However, on one hand, functions of the existing display modules are still relatively single; on the other hand, the existing display modules need to be optimized in structure when integrated with other functions.

SUMMARY

A display module is provided in the present disclosure, so as to increase functions of the display module and to make different functions of the display module better cooperate with each other.

In some embodiments, the display module may include: a first substrate and a second substrate disposed facing to each other, where the first substrate is a non-opaque substrate; a self-luminous display layer disposed between the first substrate and the second substrate, where the self-luminous display layer includes display pixels, each of the display pixels includes a light emitting device, and the light emitting device includes a self-luminous layer; an optical fingerprint sensing layer disposed between the self-luminous display layer and the second substrate, where the optical fingerprint sensing layer has a photosensitive pixel region and the photosensitive pixel region includes a plurality of photosensitive pixels; the self-luminous display layer has a non-opaque region, at least a portion of light transmitting from the first substrate to the self-luminous display layer can pass through the self-luminous display layer via the non-opaque region, and reach the optical fingerprint sensing layer; and the self-luminous display layer has a light-blocked region located between the self-luminous layer and the optical fingerprint sensing layer, and the light-blocked region is configured to prevent light emitting from the self-luminous layer from reaching the optical fingerprint sensing layer before entering the first substrate.

In some embodiments, the self-luminous display layer is an OLED display layer.

In some embodiments, the OLED display layer and the optical fingerprint sensing layer are directly laminated.

In some embodiments, a first surface of the first substrate is away from the second substrate and a distance between the plurality of photosensitive pixels and the first surface is less than 0.5 mm.

In some embodiments, a light collimation layer is disposed between the OLED display layer and the optical fingerprint sensing layer.

In some embodiments, a first surface of the first substrate is away from the second substrate and a distance between the plurality of photosensitive pixels and the first surface is less than 5 mm.

In some embodiments, the display pixels are isolated display pixels, the light emitting device includes a first electrode and a second electrode, the first electrode is a common electrode, first electrodes of all the display pixels are connected together, second electrodes of all the display pixel are isolated, and the second electrode is made of a light-blocked conductive material, and the light-blocked region includes an area where the second electrode is located.

In some embodiments, one or more isolated display pixels correspond to one of the plurality of photosensitive pixels; and an area of each of the one or more isolated display pixels is equal to an area of each of the plurality of photosensitive pixels, when each of the isolated display pixels corresponds to each of the plurality of photosensitive pixels.

In some embodiments, colors of light emitted by the isolated display pixels are white, violet, blue, cyan, green, yellow, orange, red, or near-infrared light; or the isolated display pixels include three sub pixels, and the three sub pixels are a red sub pixel, a green sub pixel, and a blue sub pixel respectively.

In some embodiments, the display pixels are passive display pixels arranged in an array, the light emitting device includes a first electrode connected with a data line in a first axial direction, and a second electrode connected with a scan line in a second axial direction, the second electrode is made of a light-blocked conductive material, and the light-blocked region includes a region where the second electrode is located.

In some embodiments, the display pixels are active display pixels arranged in an array, the light emitting device includes a first electrode and a second electrode, each of the active display pixels is connected with a data line and a scanning line, the first electrode is a common electrode, first electrodes of all the display pixels are connected together, the second electrode is made of a light-blocked conductive material, and the light-blocked region includes a region where the second electrode is located.

In some embodiments, each of the active display pixels includes an element region, a light emitting device region and a surrounding region, the element region and the light emitting device region are a portion of the light-blocked region, and the surrounding region is a portion of the non-opaque region.

In some embodiments, when the display module is performing fingerprint imaging, the self-luminous display layer serves as a light source for providing light required during the fingerprint imaging.

In some embodiments, a first surface of the first substrate is away from the second substrate, a second surface of the first substrate is near the second substrate, and a touch sensing layer is disposed on at least one of the first surface and the second surface.

In some embodiments, a top view of the self-luminous display layer, a top view of the optical fingerprint sensing layer and a top view of the touch sensing layer are overlapped.

In some embodiments, light signals are collected in an entire area of the optical fingerprint sensing layer; or the light signals are collected only in a first region, where the first region corresponds to a region of the self-luminous display layer where the touch sensing layer senses a finger pressing.

In some embodiments, a top view of the self-luminous display layer is overlapped with a top view of the touch sensing layer, an area of a top view of the optical fingerprint sensing layer is smaller than an area of a top view of the self-luminous display layer, and the top view of the optical fingerprint sensing layer is located within the top view of the self-luminous display layer.

In some embodiments, light signals are collected in an entire area of the optical fingerprint sensing layer; or the light signals are collected only in a second region, where the second region corresponds to a region of the self-luminous display layer where the touch sensing layer senses a finger pressing.

In some embodiments, a top view of the self-luminous display layer and a top view of the touch sensing layer are overlapped, a top view of the optical fingerprint sensing layer includes a plurality of sub-regions, and each of the plurality of sub-regions is located within the top view of the self-luminous display layer.

In some embodiments, light signals are collected in an entire area of the optical fingerprint sensing layer; or the light signals are collected only in a third region, where the third region corresponds to a region of the self-luminous display layer where the touch sensing layer senses a finger pressing.

Compared with the prior art, solution of the present disclosure has the following advantages.

The self-luminous display layer and the optical fingerprint sensor are arranged together, so that light emitting from the self-luminous display layer can be used for the optical fingerprint sensor to capture fingerprint images. Therefore, it is not necessary to additionally configure a light source for the optical fingerprint sensor, which saves cost and simplifies structure. In addition, the display pixels in the self-luminous display layer are divided into a non-opaque region and a light-blocked region, so as to ensure that the self-luminous display layer can display information well, and further to ensure that the optical fingerprint sensor can capture fingerprint well. Therefore, the fingerprint imaging function and information display function can be integrated together in the display module, and application range of the display module can be broadened.

Further, upper positions of the isolated display pixels in the OLED display layer correspond to lower positions of the photosensitive pixels in the optical fingerprint sensor, so as to better ensure that light in the OLED display layer can reach the optical fingerprint sensor more uniformly, and further to ensure that the fingerprint imaging function of the entire display module can be still maintained at a high level.

Further, a light collimation layer is disposed between the optical fingerprint sensor and the self-luminous display layer, so that the light emitting from the OLED display layer can transmit upward or obliquely upward and can be applied to fingerprint imaging, and then only light at a vertical angle or at a nearly vertical angle can enter the optical fingerprint sensing layer of the optical fingerprint sensor so as to be received by the photosensitive pixels. On one hand, the collected fingerprint images are clearer; on the other hand, thickness of layers stacked above the OLED display layer may be selected in a greater range, so that mechanical strength of a particular substrate (e.g., the first substrate) can be increased accordingly.

DETAILED DESCRIPTION

As described in the background art, functions of the existing display modules are still relatively simple, and the existing display modules need to be optimized in structure when the existing display modules are integrated with structures of other functions.

In view of above, a new display module is provided in the present disclosure, so that a fingerprint imaging function can be achieved in the display module, making the display module more functional and widely applied.

The foregoing objects, features and advantages of the present invention will become more apparent from the following detailed description of specific embodiments in conjunction with the accompanying drawings.

Figure 1:
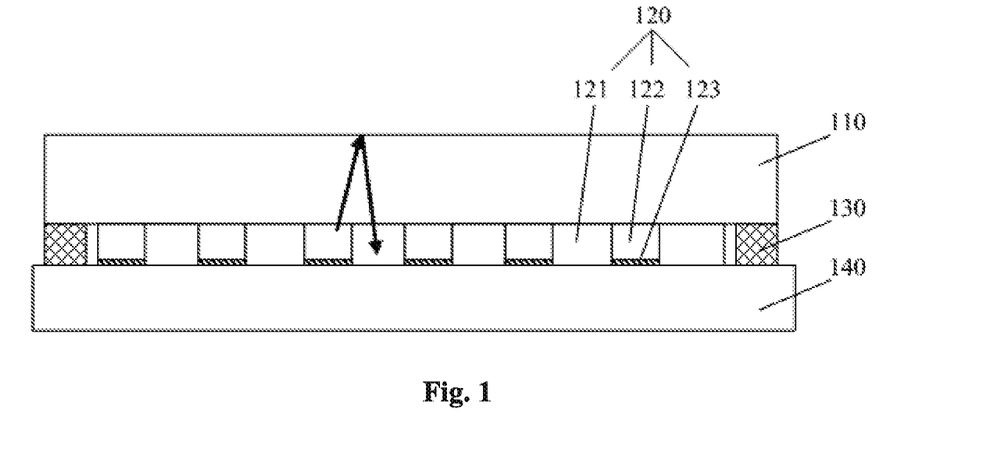
FIG. 1 schematically illustrates a diagram of a display module according to an embodiment of the present disclosure.
Figure 2:
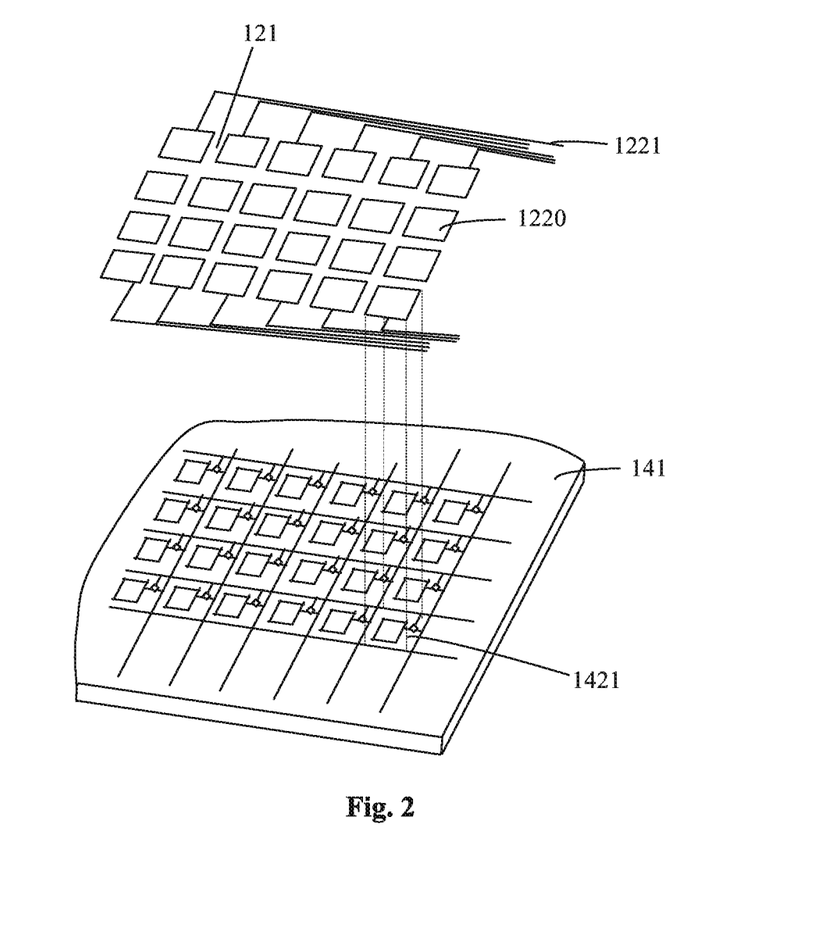
FIG. 2 schematically illustrates a stereogram of a part of the display module shown in FIG. 1.

A display module is provided according to an embodiment of the present disclosure. Referring to FIGS. 1 and 2, FIG. 1 schematically illustrates a cross-sectional view of a display module according to an embodiment of the present disclosure. FIG. 2 schematically illustrates a stereogram of a part of the display module shown in FIG. 1.

Referring to FIGS. 1 and 2, the display module may include a first substrate 110, a self-luminous display layer 120, a sealing frame 130, and an optical fingerprint sensor 140. As shown in FIG. 2, the optical fingerprint sensor 140 may include a second substrate 141, that is, the second substrate 141 is a part of the optical fingerprint sensor 140. The first substrate 110 and the second substrate 141 are disposed facing to each other, that is, the display module includes the first substrate 110 and the second substrate 141 disposed facing to each other. It should be noted that, the second substrate 141 is not shown in FIG. 1, and reference can be made to FIG. 2.

The self-luminous display layer 120 is disposed between the first substrate 110 and the second substrate 141. FIG. 2 schematically illustrates a stereogram of a part of the self-luminous display layer 120 and a part of the optical fingerprint sensor 140 shown in FIG. 1.

In some embodiments, the self-luminous display layer 120 may include a plurality of display pixels (not shown in FIG. 1), and some of the plurality of display pixels are shown in FIG. 1 for exemplary illustration. The plurality of display pixels may include light emitting regions 122. It should be noted that, not an entire region of each of the light emitting regions 122 can emit light, but a self-luminous layer is disposed in the upper and lower stacked layers in the entire region, which will be described in the following.

Referring to FIGS. 1 and 2, in some embodiments, the display module may further include an optical fingerprint sensing layer (not shown in FIG. 1, a portion of the optical fingerprint sensing layer is shown in FIG. 2 but is not marked) located between the self-luminous display layer 120 and the second substrate 141. The optical fingerprint sensing layer also belongs to a part of the optical fingerprint sensor 140, and is located between the self-luminous display layer 120 and the second substrate 141. The optical fingerprint sensing layer generally includes a multi-layer structure and a variety of devices to achieve a fingerprint imaging function. However, for simplicity of illustration, specific structures of the variety of devices of the optical fingerprint sensor 140 are not shown in FIG. 1.

In some embodiments, the first substrate 110 is a non-opaque substrate, and a material of the first substrate 110 may be glass or plastic etc. The second substrate 141 may be a non-opaque substrate or a light-blocked substrate. Since the second substrate 141 may be a light-blocked substrate, structures and formation processes of the optical fingerprint sensor 140 may be extensive. For example, the optical fingerprint sensor 140 may be either a wafer-based CMOS device sensor or a thin film transistor device sensor, where substrates of the thin film transistor device sensor may be made of a non-opaque material such as glass.

In some embodiments, the self-luminous display layer 120 may be an OLED display layer. The OLED display layer makes the entire display module become an OLED display module. The OLED display module possesses a self-luminous ability and excellent performance such as a high contrast, a thin thickness, a wide viewing angle, a high response speed, a wide use temperature range and a simple structure and so on.

In some embodiments, each of the display pixels may include a light emitting device (not shown separately), since the self-luminous display layer 120 is an OLED display layer, the light emitting device may include an OLED light emitting stacked layer. It can be understood that the light emitting device may include a self-luminous layer (not shown). A light-blocking layer 123 is disposed between the self-luminous layer and the optical fingerprint sensor 140, which will be described in detail in the following.

FIG. 2 schematically illustrates a structural diagram of a part of the self-luminous display layer 120 and a part of the optical fingerprint sensor 140. The optical fingerprint sensor 140 may include a second substrate 141 and an optical fingerprint sensing layer disposed on a surface of the second substrate 141. As shown in FIG. 2, the optical fingerprint sensing layer may include a plurality of photosensitive pixels 1421, each of the plurality of photosensitive pixels 1421 may include a photosensitive device (not shown) and a TFT device switch (not shown) and so on, and the optical fingerprint sensing layer may further include data lines (not shown) and scanning lines (not shown) and so on. It can be seen from FIG. 2 that, the optical fingerprint sensing layer has a photosensitive pixel region (not shown all), and the photosensitive pixel region includes the plurality of photosensitive pixels 1421.

It should be noted that, in FIG. 2, there is a large distance between the part of the self-luminous display layer 120 and the part of the optical fingerprint sensing layer. It will be appreciated that, in an actual structure, the self-luminous display layer 120 and the optical fingerprint sensing layer are directly stacked.

Referring to FIG. 1, the self-luminous display layer 120 may include a non-opaque region 121, and structures in the non-opaque region 121 can transmit light so that at least a portion of the light transmitting from the first substrate 110 to the self-luminous display layer 120 can pass through the self-luminous display layer 120 via the non-opaque region 121, and reach the optical fingerprint sensing layer. That is, the non-opaque region 121 is configured to ensure that the light transmitting from the first substrate 110 to the optical fingerprint sensing layer can pass through the self-luminous display layer 120.

In some embodiments, light emitting from the self-luminous display layer 120 reaches the first non-opaque substrate 110, and at least a portion of the light is used to capture a fingerprint image and to generate a reflected light, then the reflected light is returned, passes through the first non-opaque substrate 110 and the self-luminous display layer 120 successively, and is finally received by the photosensitive pixels 1421 of the optical fingerprint sensing layer. Transmission paths of the portion of the light may refer to arrows shown in FIG. 1.

In some embodiments, light passing through the self-luminous display layer 120 from the non-opaque region 121 may refer to the light passing through the self-luminous display layer 120 from a thickness direction of the self-luminous display layer 120. As shown in the cross-sectional view of FIG. 1, the light passes through the self-luminous display layer 120 in a vertical direction.

Referring to FIG. 1, in some embodiments, the self-luminous display layer 120 may further include a light-blocked region (not shown), which are located between the self-luminous layer and the optical fingerprint sensing layer. The light-blocked region is configured to prevent the light emitting from the self-luminous layer from reaching the optical fingerprint sensing layer before entering the first substrate 110.

In some embodiments, the light-blocked region is formed by one of electrode layers of the light emitting device (i.e., the OLED light emitting stacked layers). The display pixels may be isolated display pixels 1220 (as shown in FIG. 2), and each of the isolated display pixels 1220 may include a first electrode (not shown) and a second electrode (i.e., the light-blocking layer 123). The first electrode is a common electrode. In some embodiments, the first electrodes of all the display pixels are connected together, and the second electrodes of all the display pixels are isolated. The first electrode is made of a non-opaque conductive material, and the second electrode is made of a light-blocked conductive material. The second electrode may serve as a light-blocking layer 123, which is located between the self-luminous layer and the optical fingerprint sensing layer (i.e., between the self-luminous layer and the optical fingerprint sensor 140). That is, the light-blocked region includes a region where the second electrode is located.

In other embodiments, the light-blocking layer may be not one of the electrode layers, but may be an additional layer structure disposed between the self-luminous layer and the optical fingerprint sensing layer.

In some embodiments, the self-luminous layer is located between the first electrode and the second electrode, so that the light emitting from the self-luminous layer can be blocked by the light-blocking layer 123, to prevent the light from transmitting downward to the optical fingerprint sensing layer before transmitting upward then being applied to the fingerprint imaging.

In some embodiments, the first electrode is an electrode close to the first substrate 110, and the second electrode is an electrode close to the second substrate 141. When the first electrode is an anode, the second electrode is a cathode; or when the first electrode is a cathode, the second electrode is an anode.

Referring to FIG. 1, the display module may further include a sealing frame 130 located between the first substrate 110 and the optical fingerprint sensor 140. In some embodiments, the sealing frame 130 may be a plastic frame or be made of a combination of other rigid frame materials and glue.

In some embodiments, the sealing frame 130 is sealed around the self-luminous display layer 120 between the first substrate 110 and the optical fingerprint sensor 140. It is not shown in FIG. 1 whether or not the sealing frame 130 seals the optical fingerprint sensing layer. Specifically, the sealing frame 130 may seal the optical fingerprint sensing layer between the first substrate 110 and the second substrate 141, or not seal the optical fingerprint sensor layer.

With continued reference to FIG. 2, the isolated display pixels 1220 are individually connected with a corresponding control circuit (some of the leads are not shown) via a lead 1221.

In some embodiment, the lead 1221 may be made of a transparent conductive material. The non-opaque region 121 shown in FIG. 1 may include space regions between the second electrodes. That is, regions between the second electrodes may be a part of the non-opaque region 121.

In some embodiments, the OLED display layer and the optical fingerprint sensing layer are directly stacked. FIG. 2 only schematically illustrates a structure diagram of a partial of the optical fingerprint sensing layer. In addition, the optical fingerprint sensing layer may further include a protective film layer.

During a fabrication process of the display module, an OLED display layer may be formed on a lower surface of the first substrate 110, the optical fingerprint sensing layer may be formed on an upper surface of the second substrate 141, and then the first substrate 110 and the second substrate 141 may be face to face laminated and bonded to each other, so that the OLED display layer and the optical fingerprint sensing layer can be face to face bonded and sealed between the first substrate 110 and the second substrate 141. In this condition, a thickness of the entire display module and cost of the display module can be reduced.

In some embodiments, in the condition that the OLED display layer and the optical fingerprint sensing layer are directly laminated, a distance between the photosensitive pixels 1421 and a first surface is set as less than 0.5 mm, where a surface of the first substrate 110 away from the second substrate 141 is referred to the first surface. When the distance between the photosensitive pixels 1421 and the first surface is less than 0.5 mm, it can be ensured that, quality of the captured fingerprint images meets requirements.

With continued reference to FIG. 2, in some embodiments, one of the photosensitive pixels 1421 may correspond to (one way of the "correspond to" may be "exactly face to") one of the isolated display pixels 1220, and an area of one of the photosensitive pixels 1421 may be equal to an area of one of the isolated display pixels 1220. The non-opaque region 121 of the isolated display pixels 1220 at least exactly faces to a partial region of the photosensitive device of the photosensitive pixels 1421. Since the photosensitive pixels 1421 have a same area with the isolated display pixels 1220, the photosensitive pixels 1421 and the isolated display pixels 1220 may be not aligned one by one, and a certain dislocation may exist therebetween. In a macroscopic view, an alignment relationship between each photosensitive pixel 1421 and each isolated display pixel 1220 is uniform. Therefore, the transmitted or reflected optical signals received by each photosensitive pixel 1421 can be uniform.

In other embodiments, a plurality of isolated display pixels 1220 may correspond to one photosensitive pixel 1421. That is, a photosensitive pixel 1421 may correspond to two or more isolated display pixels 1220. In a macroscopic view, an alignment relationship between each photosensitive pixel 1421 and the two or more isolated display pixels 1220 is uniform. Therefore, it can be ensured that the transmitted or reflected optical signals received by each photosensitive pixel 1421 are uniform.

In some embodiments, colors of light emitted by each isolated display pixel 1220 may be white, violet, blue, cyan, green, yellow, orange, red, or near-infrared light. In other embodiments, each isolated display pixel may include three sub pixels, i.e., a red sub-pixel, a green sub-pixel and a blue sub-pixel respectively.

In the display module according to embodiments of the present disclosure, when the display module performs fingerprint imaging, the self-luminous display layer 120 may function as a light source for providing light required during the fingerprint imaging.

It is difficult to combine a display function with a fingerprint imaging function, because two kinds of devices corresponding to the above two functions may be adversely affected during implementation. In the present disclosure, a substrate under a conventional OLED display module is directly replaced with an optical fingerprint sensor 140, so that the OLED display function can be integrated with the fingerprint imaging function. Using the optical fingerprint sensor 140 as a substrate makes it possible for the two functions that were previously difficult to be integrated together cooperate well with each other to form a more desirable structure.

In the present disclosure, the OLED display layer and the optical fingerprint sensor 140 are arranged together, so that the light emitting from the OLED display layer can be used for the optical fingerprint sensor 140 to capture fingerprint images, therefore it is not necessary to additionally configure a light source for the optical fingerprint sensor 140, thereby saving cost and simplifying structure. In addition, the display pixels in the OLED display layer are divided into the non-opaque region 121 and the light-blocked region, so as to ensure that the OLED display layer can display information well, and also to ensure that the optical fingerprint sensor 140 can capture fingerprint well. Finally, the entire display module can integrate fingerprint imaging function and information display function together, thereby expanding application range of the display module.

That is, in the present embodiment, the optical fingerprint sensor 140 and the OLED display layer are arranged together by virtue of characteristic properties of the OLED display layer (e.g., having a certain light transmittance) and properties of the optical fingerprint sensor 140, and functions of the OLED display layer and functions of the optical fingerprint sensor 140 are combined by a mutual cooperation of the OLED display layer and the optical fingerprint sensor 140 in use, so that the entire display module can not only have an information display function but also have a fingerprint imaging function.

In addition, upper positions of the isolated display pixels 1220 in the OLED display layer correspond to lower positions of the photosensitive pixels 1421 in the optical fingerprint sensor 140, so as to better ensure that light of the OLED display layer can reach the optical fingerprint sensor 140 more uniformly, and further to ensure that fingerprint imaging function of the entire display module can be still maintained at a high level.

The display module provided according to embodiments of the present disclosure may be assembled in an electronic product such as a mobile phone and so on. In some embodiments, the entire display module may be assembled in a phone shell, and a protective cover plate (a protective layer) may be disposed in positions corresponding to the first substrate 110, and a surface of the protective cover plate may be a contact interface of a fingerprint. In some embodiments, the first substrate 110 may be directly used as a contact interface of a fingerprint. In such an electronic product, an optical phenomenon such as reflection and refraction and so on may occur when light emitting from the self-luminous display layer 120 reaches an interface between the finger's epidermis and a corresponding substrate (the first substrate 110, or the protective cover plate). Thereafter, the reflected light at least partially returns to the first non-opaque substrate 110 and can pass through the self-luminous display layer 120 from the non-opaque region 121, so as to enter the photosensitive pixels 1421 of the optical fingerprint sensing layer and to be received by the photosensitive pixels 1421.

Figure 3:
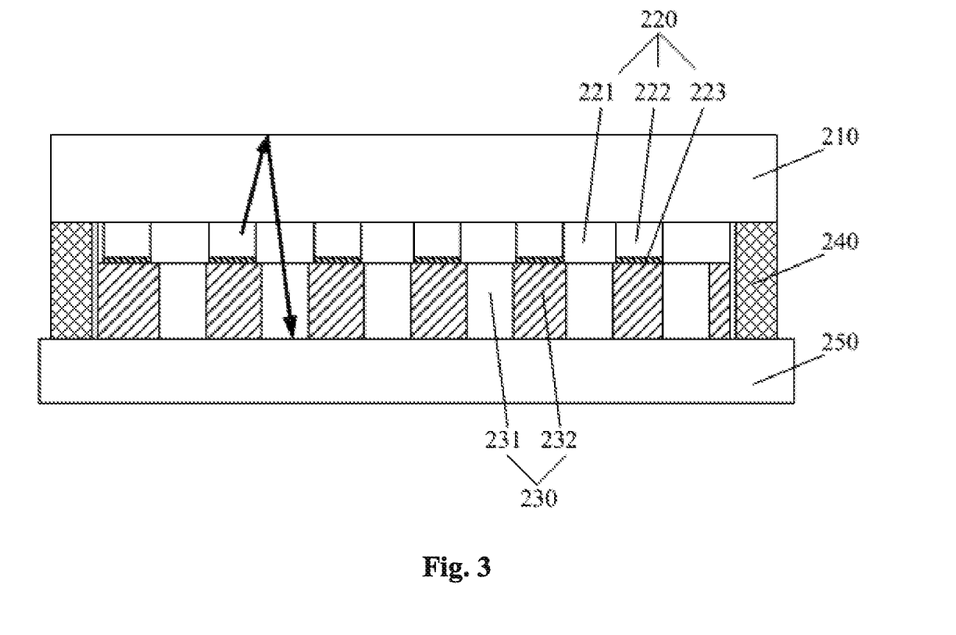
FIG. 3 schematically illustrates a diagram of a display module according to another embodiment of the present disclosure.
Figure 4:
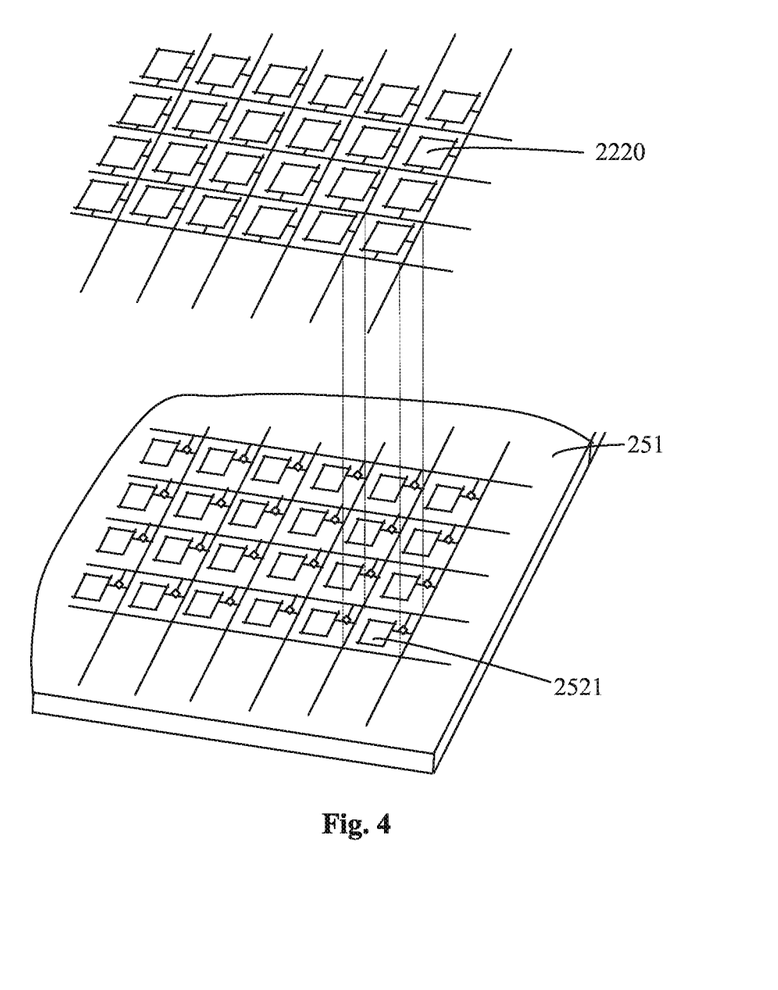
FIG. 4 schematically illustrates a stereogram of a part of the display module shown in FIG. 3.

A display module is provided according to another embodiment of the present disclosure. With reference to FIGS. 3 and 4, FIG. 3 schematically illustrates a cross-sectional view of a display module according to another embodiment of the present disclosure. FIG. 4 schematically illustrates a stereogram of a part of the display module shown in FIG. 3.

Referring to FIGS. 3 and 4, the display module may include a first substrate 210, a self-luminous display layer 220, a sealing frame 240 and an optical fingerprint sensor 250. As shown in FIG. 4, the optical fingerprint sensor 250 may include a second substrate 251, that is, the second substrate 251 is a part of the optical fingerprint sensor 250. The first substrate 210 and the second substrate 251 are disposed face to face. That is, the display module may include the first substrate 210 and the second substrate 251 disposed face to face. It should be noted that, the second substrate 251 is not shown in FIG. 3, and reference may be made to FIG. 4.

Referring to FIGS. 3 and 4, the self-luminous display layer 220 is disposed between the first substrate 210 and the second substrate 251. FIG. 4 schematically illustrates a stereogram of a part of the self-luminous display layer 220 and a part of the optical fingerprint sensor 250 shown in FIG. 3.

In some embodiments, the self-luminous display layer 220 may include a plurality of display pixels (not marked in FIG. 3), and some of the plurality of display pixels are shown in FIG. 3 for exemplary illustration. The plurality of display pixels may include a light-emitting region 222. It should be noted that, not an entire region of the light-emitting region 222 can emit light, but a self-luminous layer is disposed in the stacked layers of the entire region.

Referring to FIGS. 3 and 4, the display module may further include an optical fingerprint sensing layer (not shown in FIG. 3) between the self-luminous display layer 220 and the second substrate 251, and a part of the optical fingerprint sensing layer is shown in FIG. 4 but is not labeled. The optical fingerprint sensing layer also belongs to a part of the optical fingerprint sensor 250, and is located between the self-luminous display layer 220 and the second substrate 251. The optical fingerprint sensing layer generally includes a multi-layer structure and a variety of devices so as to achieve a fingerprint imaging function. For simplicity of illustration, specific structures of the variety of devices of the optical fingerprint sensor 250 are not shown in FIG. 3.

In some embodiments, the first substrate 210 may be a non-opaque substrate, and a material of the first substrate 210 may be glass or plastic etc. The second substrate 251 may be a non-opaque substrate or a light-blocked substrate. Since the second substrate 251 may be a light-blocked substrate, structures and formation processes of the optical fingerprint sensor 250 may be extensive. For example, the optical fingerprint sensor 250 may be either a wafer-based CMOS device sensor or a thin film transistor device sensor, where substrates of the thin film transistor device sensor may be made of a non-opaque material such as glass.

In some embodiments, the self-luminous display layer 220 may be an OLED display layer. Each display pixel may include a light emitting device (not shown in FIG. 4), since the self-luminous display layer 220 is the OLED display layer, therefore the light emitting device may include an OLED light-emitting stacked layer. It can be understood that, the light emitting device may include a self-luminous layer (not shown). A light-blocking layer 223 is disposed between the self-luminous layer and the optical fingerprint sensor 250, which will be described in detail in the following.

FIG. 4 schematically illustrates a structural diagram of a part of the self-luminous display layer 220 and a part of the optical fingerprint sensor 250. The optical fingerprint sensor 250 may include a second substrate 251 and an optical fingerprint sensing layer disposed on a surface of the second substrate 251. The optical fingerprint sensing layer may include a plurality of photosensitive pixels 2521, each of the plurality of photosensitive pixels 2521 may include a photosensitive device (not shown) and a TFT device switch (not shown) and so on, and the optical fingerprint sensing layer may further include data lines (not labeled) and scanning lines (not labeled) and so on. It can be seen from FIG. 4 that, the optical fingerprint sensing layer has a photosensitive pixel region (not shown all), and the photosensitive pixel region includes the plurality of photosensitive pixels 2521.

Referring to FIG. 3, the self-luminous display layer 220 has a non-opaque region 221, and at least a part of the light transmitting from the first substrate 210 to the self-luminous display layer 220 can pass through the self-luminous display layer 220 via the non-opaque region 221, and reach the optical fingerprint sensing layer. That is, the non-opaque region 221 is configured to ensure that the light transmitting from the first substrate 210 to the optical fingerprint sensing layer can pass through the self-luminous display layer 220.

In some embodiments, light emitting from the self-luminous display layer 220 may be at least partially transmitted through the optical fingerprint sensing layer to the first non-opaque substrate, and the light is at least partially applied to capture a fingerprint image to produce reflected light, and the reflected light is returned and received by the plurality of photosensitive pixels 2521 of the optical fingerprint sensing layer. Transmission paths of the light may refer to arrows shown in FIG. 3.

In some embodiments, light passing through the self-luminous display layer 220 from the non-opaque region 221 may refer to the light passing through the self-luminous display layer 220 from a thickness direction of the self-luminous display layer 220, as shown in the cross-sectional view of FIG. 3, the light passes through the self-luminous display layer 220 in a vertical direction. It should be noted that, although the light transmitted in an oblique direction is shown for an exemplary illustration, the light may be transmitted firstly in an upward direction then in a downward direction.

Referring to FIG. 3, in some embodiments, the self-luminous display layer 220 may further include a light-blocked region (not labeled), which is located between the self-luminous layer and the optical fingerprint sensing layer. The light-blocked region is configured to prevent the light emitting from the self-luminous layer from reaching the optical fingerprint sensing layer before entering the first substrate 210.

In some embodiments, the light-blocked region is formed by one of electrode layers of the light emitting device (i.e., the OLEIC light emitting stacked layers).

Referring to FIG. 4, in some embodiments, the display pixels may be passive display pixels 2220 which are arranged in an array, the light emitting device may include a first electrode (not shown) and a second electrode (not shown), the first electrode may be connected with a data line in a first axial direction (not labeled), and the second electrode may be connected with a scanning line in a second axial direction (not labeled). The data lines and the scanning lines define a plurality of grid regions that are arranged in an array. The second electrode may be made of a light-blocked conductive material, and the light-blocked region may include a region where the second electrode is located.

The self-luminous display layer 220 may include a plurality of passive display pixels 2220 arranged in an array. First electrodes of each row of passive display pixels 2220 are connected with a same data line (not labeled) in the first axial direction, and second electrodes of each column of passive display pixels are connected with a same scan line (not labeled) in the second axial direction. Those data lines are insulated from each other.

The first electrodes are insulated from each other, and the second electrodes are insulated from each other. The first electrode may be made of a transparent conductive material, and the second electrode may be made of a light-blocked conductive material, for example, a metallic material.

In some embodiments, the second electrode may serve as a light-blocking layer 223. In other embodiments, an opaque layer may be additionally added as a light-blocking layer.

Referring to FIG. 4, in some embodiments, a photosensitive pixel 2521 may correspond to a passive display pixel 2220. The non-opaque region 221 of the passive display pixels 2220 may at least exactly face to a partial region of the photosensitive devices of the photosensitive pixels 2521. If appropriately translation is performed to the photosensitive pixels 2521 and the passive display pixels 2220, the two kinds of pixels may basically coincide, that is, the two kinds of pixels may have an equal area. Since the photosensitive pixels 2521 have a same area with the passive display pixels 2220, it may be not necessary for the photosensitive pixels 2521 and the passive display pixels 2220 to be aligned one by one, and a certain dislocation may exist therebetween. In a macroscopic view, an alignment relationship between each photosensitive pixel 2521 and each passive display pixel 2220 may be uniform. Therefore, the transmitted optical signals received by each photosensitive pixel 2521 may be uniform.

In other embodiments, two or more display pixels (i.e., passive display pixels) may correspond to one photosensitive pixel. In a macroscopic view, an alignment relationship between each photosensitive pixel and the two or more display pixels may be uniform. Therefore, it can be ensured that the transmitted optical signals received by each photosensitive pixel are uniform.

In some embodiments, colors of light emitted by the passive display pixels 2220 may be white, violet, blue, cyan, green, yellow, orange, red, or near-infrared light. In other embodiments, each passive display pixel may include three sub pixels, i.e., a red sub-pixel, a green sub-pixel and a blue sub-pixel respectively.

Referring to FIG. 3, in some embodiments, a light collimation layer 230 may be disposed between the OLED display layer and the optical fingerprint sensing layer. The light collimation layer 230 may at least partially absorb oblique light transmitting from the first substrate to the optical fingerprint sensing layer, allowing light at a vertical angle or at a nearly vertical angle (a maximum difference between the nearly vertical angle and the vertical angel may be less than 10 degrees) to pass through the light collimated layer 230 and to enter the photosensitive pixels 2521 of the optical fingerprint sensing layer.

In some embodiments, the light collimation layer 230 may include a non-opaque region 231 and a light-blocking region 232, where the non-opaque region 231 may be a non-opaque hole, and the light-blocking region 232 may be a light-blocking frame. Since the non-opaque region 231 is an elongated region, and the light-blocking region 232 surrounds the non-opaque region 231, when the stray light is incident, the light-blocking region 232 may block and absorb a large amount of oblique incident light, and only allow vertical or near-vertical light (an angle difference between the nearly vertical angle and the vertical angel may be less than 10 degrees) to pass through the light collimation layer 230, so that a light collimation effect can be achieved by the light collimation layer 230.

In some embodiments, the light collimation layer 230 may be a single layer structure. In other embodiments, the light collimation layer 230 may be a multilayer structure.

Referring to FIG. 3, in some embodiments, the display module may further include a sealing frame 240 between the first substrate 210 and the optical fingerprint sensor 250. The sealing frame 240 may be a plastic frame or be made of a combination of other rigid frame materials and glue.

In some embodiments, the sealing frame 240 is sealed around the self-luminous display layer 220 disposed between the first substrate 210 and the optical fingerprint sensor 250. It is not shown in FIG. 3 whether or not the sealing frame 240 seals the optical fingerprint sensing layer. Specifically, the sealing frame 130 may also seal the optical fingerprint sensing layer between the first substrate 210 and the second substrate 251, or not seal the optical fingerprint sensing layer.

In some embodiments, the OILED display layer and the light collimation layer 230 are directly stacked. FIG. 4 only schematically illustrates a partial structure of the optical fingerprint sensing layer, besides that the optical fingerprint sensing layer may further include a protective film layer (not shown), and the light collimation layer 230 (not shown in FIG. 4) may be directly formed on a surface of the protective film layer on an outermost surface of the optical fingerprint sensing layer.

During a fabrication process of the display module, the OLED display layer may be formed on a lower surface of the first substrate 210, the optical fingerprint sensing layer may be formed on an upper surface of the second substrate 251, the protective film layer may be formed on the optical fingerprint sensing layer, and then the light collimation layer 230 may be formed on a surface of the protective film layer, and finally the first substrate 210 and the second substrate 251 may be face to face laminated and bonded to each other, so that the OLED display layer, the light collimation layer 230 and the optical fingerprint sensing layer can be bonded and sealed between the first substrate 210 and the second substrate 251.

In other embodiments, the OLED display layer may be formed on a lower surface of the first substrate 210, the protective film layer may be formed on the OLED display layer, the light collimation layer 230 may be formed on the protective film layer, the optical fingerprint sensing layer may be formed on an upper surface of the second substrate 251, and then the first substrate 210 and the second substrate 251 are face to face laminated, so that the OLED display layer, the light collimation layer 230 and the optical fingerprint sensing layer can be bonded and sealed between the first substrate 210 and the second substrate 251.

In some embodiments, in the condition that the light collimation layer 230 is disposed between the OLED display layer and the optical fingerprint sensing layer, a distance between the photosensitive pixels 2521 and a first surface is set as less than 5 mm, where a surface of the first substrate 210 away from the second substrate 251 is the first surface. Then a thickness of the first substrate 210 may be selected in a relatively larger range.

In the display module according to embodiments of the present disclosure, when the display module performs fingerprint imaging, the self-luminous display layer 220 may function as a light source for providing the light required during the fingerprint imaging.

In the present disclosure, a substrate under a conventional OLED display module is directly replaced with an optical fingerprint sensor 250, so that display function of the OLED can be integrated with the fingerprint imaging function. Using the whole optical fingerprint sensor 250 as a substrate makes it possible for the two functions that were previously difficult to be integrated together cooperate well with each other to form a more desirable structure.

In the present disclosure, the OLED display layer and the optical fingerprint sensor 250 are arranged together, so that the light emitting from the OLED display layer can be used for the optical fingerprint sensor 250 to collect fingerprint images, therefore it is not necessary to additionally configure a light source for the optical fingerprint sensor 250, thereby saving cost and simplifying structure. In addition, the display pixels in the OLED display layer are divided into the non-opaque region 221 and the light-blocked region, so as to ensure that the OLED display layer can display information well, and further to ensure that the optical fingerprint sensor 250 can capture fingerprint well. Therefore, the fingerprint imaging function and the information display function can be integrated together in the entire display module, and an application range of the display module can be expanded.

That is, in the present embodiment, the optical fingerprint sensor 250 and the OLED display layer are arranged together by virtue of characteristic properties of the OLED display layer (e.g., having a certain light transmittance) and properties of the optical fingerprint sensor 250, and functions of the OLED display layer and functions of the optical fingerprint sensor 250 are combined by a mutual cooperation of the optical fingerprint sensor 250 and the OLED display layer in use, so that the entire display module can not only have an information display function but also have a fingerprint imaging function.

In addition, upper positions of the passive display pixels 2220 in the OLED display layer correspond to lower positions of the photosensitive pixels 2521 in the optical fingerprint sensor 250, so as to better ensure that light of the OLED display layer can reach the optical fingerprint sensor 250 more uniformly, and further to ensure that fingerprint imaging function of the entire display module can be still maintained at a high level.

The display module provided according to embodiments of the present disclosure may be assembled in an electronic product such as a mobile phone and so on. In some embodiments, the entire display module may be assembled in a phone shell, and a protective cover plate (a protective layer) may be disposed in a position corresponding to the first substrate 210, and a surface of the protective cover plate may be a contact interface of a fingerprint. In some embodiments, the first substrate 210 may be directly used as a contact interface of a fingerprint. In such an electronic product, an optical phenomenon such as reflection and refraction and so on may occur when light emitting from the self-luminous display layer 220 reaches an interface between a finger's epidermis and a corresponding substrate (i.e., the first substrate 210, or the protective cover plate). Thereafter, the reflected light at least partially returns to the first non-opaque substrate and can pass through the self-luminous display layer 220 from the non-opaque region 221, so as to enter the photosensitive pixels 2521 of the optical fingerprint sensing layer and to be received by the photosensitive pixels 2521.

In some embodiments, a light collimation layer 230 is disposed between the optical fingerprint sensor 250 and the OLED display layer (i.e., self-luminous display layer 220), so that the light emitted by the OLED display layer can transmit upward or obliquely upward and can be applied to fingerprint imaging, and then only light at a vertical angle or at a nearly vertical angle can enter the optical fingerprint sensing layer of the optical fingerprint sensor 250 so as to be received by the photosensitive pixels 2521. On one hand, the captured fingerprint images may be clearer, on the other hand, thickness of layers stacked above the OLED display layer including the first substrate 210 or other substrates may be selected in a greater range, so that mechanical strength of a particular substrate (e.g., the first substrate 210) can be increased accordingly.

Figure 5:
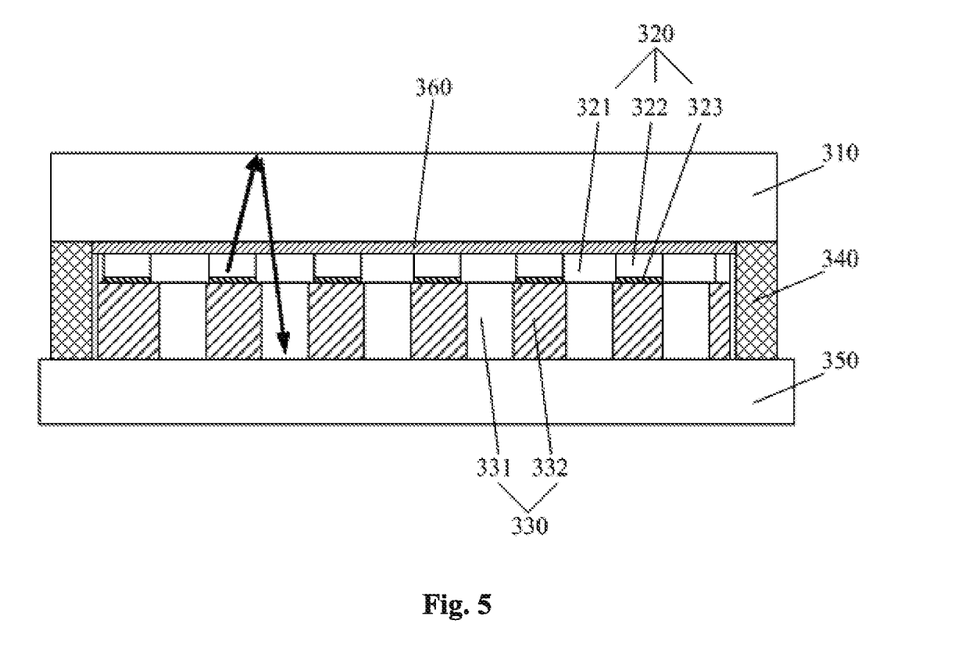
FIG. 5 schematically illustrates a diagram of a display module according to another embodiment of the present disclosure.
Figure 6:
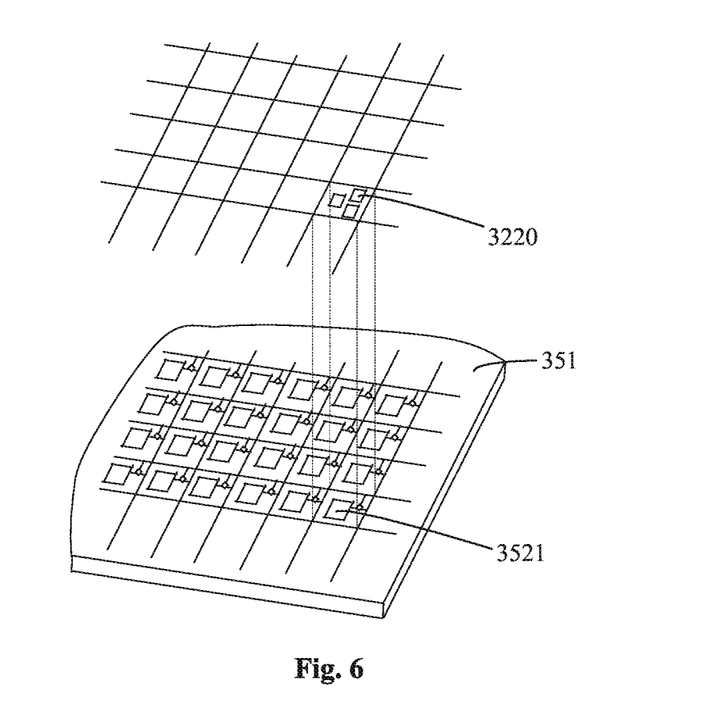
FIG. 6 schematically illustrates a stereogram of a part of the display module shown in FIG. 5.

A display module is also provided according to another embodiment of the present disclosure. With reference to FIGS. 5 and 6, FIG. 5 schematically illustrates a cross-sectional view of a display module according to another embodiment of the present disclosure. FIG. 6 schematically illustrates a stereogram of a part of the display module shown in FIG. 5.

Referring to FIGS. 5 and 6, in some embodiments, the display module may include a first substrate 310, a self-luminous display layer 320, a sealing frame 340 and an optical fingerprint sensor 350. As shown in FIG. 6, the optical fingerprint sensor 350 may include a second substrate 351. The first substrate 310 and the second substrate 351 are disposed face to face. It should be noted that, the second substrate 351 is not shown in FIG. 5, and reference may be made to FIG. 6.

The self-luminous display layer 320 is located between the first substrate 310 and the second substrate 351. FIG. 6 schematically illustrates a stereogram of a part of the self-luminous display layer 320 and a part of the optical fingerprint sensor 350 shown in FIG. 5.

In some embodiments, the self-luminous display layer 320 may include display pixels (not shown in FIG. 5), and some of the display pixels are shown in FIG. 5 for exemplary illustration. The display pixels may include a light emitting region 322. It should be noted that, not an entire region of the light emitting region 322 can emit light, but a self-luminous layer is disposed in the stacked layers in the entire region.

Referring to FIGS. 5 and 6, in some embodiments, the display module may further include an optical fingerprint sensing layer (not shown in FIG. 5, a portion of the optical fingerprint sensing layer is shown in FIG. 6 but is not labeled) located between the self-luminous display layer 320 and the second substrate 351. The optical fingerprint sensing layer also belongs to a part of the optical fingerprint sensor 350, and is located between the self-luminous display layer 320 and the second substrate 351. The optical fingerprint sensing layer generally includes a multi-layer structure and a variety of devices to achieve a fingerprint imaging function. However, for simplicity of illustration, specific structures of the variety of devices of the optical fingerprint sensor 350 are not shown in FIG. 5.

In some embodiments, the first substrate 310 may be a non-opaque substrate, and a material of the first substrate 310 may be glass or plastic etc. The second substrate 351 may be a non-opaque substrate or a light-blocked substrate. Since the second substrate 351 may be a light-blocked substrate, structures and formation processes of the optical fingerprint sensor 350 may be extensive. For example, the optical fingerprint sensor 350 may be either a wafer-based CMOS device sensor or a thin film transistor device sensor, where substrates of the thin film transistor device sensor may be made of a non-opaque material such as glass.

In some embodiments, the self-luminous display layer 320 may be an OLED display layer. Each of the display pixels may include a light emitting device (not shown in FIG. 6), the self-luminous display layer 320 is an OLED display layer, and thus the light-emitting device may include an OLED light-emitting stacked layer. It can be understood that, the light-emitting device may include a self-luminous layer (not shown). A light-blocking layer 323 is disposed between the self-luminous layer and the optical fingerprint sensor 350.

FIG. 6 schematically illustrates a structural diagram of a part of the self-luminous display layer 320 and a part of the optical fingerprint sensor 350. The optical fingerprint sensor 350 may include a second substrate 351 and an optical fingerprint sensing layer disposed on a surface of the second substrate 351. The optical fingerprint sensing layer may include a plurality of photosensitive pixels 3521, each of the photosensitive pixels 3521 may include a photosensitive device (not labeled) and a TFT device switch (not labeled) and so on, and the optical fingerprint sensing layer may further include data lines (not labeled) and scanning lines (not labeled) and so on. It can be seen from FIG. 6 that, the optical fingerprint sensing layer has a photosensitive pixel region (not shown all), and the photosensitive pixel region has a plurality of photosensitive pixels 3521.

Referring to FIG. 5, the self-luminous display layer 320 may include a non-opaque region 321, and at least a partial of the light transmitting from the first substrate 310 to the self-luminous display layer 320 can pass through the self-luminous display layer 320 from the non-opaque region 321, and reach the optical fingerprint sensing layer. That is, the non-opaque region 321 is configured to ensure that the light transmitting from the first substrate 310 to the optical fingerprint sensing layer can pass through the self-luminous display layer 320.

In some embodiments, light emitting from the self-luminous display layer 320 may at least partially pass through the optical fingerprint sensing layer and reach the first non-opaque substrate, and at least a portion of the light is applied to capture a fingerprint image and to generate a reflected light, the reflected light is returned and received by the photosensitive pixels 3521 of the optical fingerprint sensing layer. Transmission paths of the portion of the light may refer to arrows shown in FIG. 5.

In some embodiments, light passing through the self-luminous display layer 320 from the non-opaque region 321 may refer to the light passing through the self-luminous display layer 320 from a thickness direction of the self-luminous display layer 320, as shown in the cross-sectional view of FIG. 5, the light passes through the self-luminous display layer 320 in an upward direction or a downward direction.

Referring to FIG. 5, in some embodiments, the self-luminous display layer 320 may further include a light-blocked region (not labeled), which is located between the self-luminous layer and the optical fingerprint sensing layer. The light-blocked region is configured to prevent the light emitting from the self-luminous layer from reaching the optical fingerprint sensing layer before entering the first substrate 310.

In some embodiments, the light-blocked region is formed by one layer of electrodes of the light-emitting device (i.e., the OLED light-emitting stacked layers).

In some embodiments, the display pixels may be active display pixels 3220 which are arranged in an array, each of the active display pixels 3220 may include a light emitting device (not shown), an element region and a surrounding region, where the element region and the light emitting device region are a portion of the light-blocked region, and the surrounding region is a portion of the non-opaque region. Specifically, the light emitting device may include a first electrode (not shown) and a second electrode (not shown), the first electrode may be made of a transparent conductive material, the second electrode may be made of a light-blocked conductive material, and the light-blocked region may include a region where the second electrode is located.

The self-luminous display layer 320 may include a plurality of active display pixels 3220 arranged in an array. Each of the active display pixels 3220 may include one light-emitting device and one or more TFT device (not shown), each active display pixel 3220 is connected with a data line (not labeled) and a scanning line (not labeled) through a TFT device. The light emitting device may include an anode layer and a cathode layer, wherein the anode layer may be a first electrode (or a second electrode), and the cathode layer may be a second electrode (or a first electrode). When the anode layer is closer to the first surface than the cathode layer, the cathode layer may be made of a light-blocked material such as metal etc. so as to form the light-blocked region. Conversely, when the cathode layer is closer to the first surface than the anode layer, the anode layer may be made of a light-blocked material such as metal etc.

In some embodiments, the second electrode may serve as a light-blocking layer 323. In other embodiments, a light-blocked layer may be additionally added as a light-blocking layer.

In some embodiments, one of the photosensitive pixels 3521 may face to one of the active display pixels 3220. As shown in FIG. 6, the non-opaque region 321 of the active display pixels 3220 at least exactly faces to a partial region of the photosensitive devices of the photosensitive pixels 3521. If appropriately translation is performed to the photosensitive pixels 3521 and the active display pixels 3220, the two kinds of pixels may basically coincide, that is, the two kinds of pixels may have an equal area. Since the photosensitive pixels 3521 have a same area with the active display pixels 3220, it may be not necessary for the photosensitive pixels 3521 and the active display pixels 3220 to be aligned one by one, and a certain dislocation may exist therebetween. In a macroscopic view, an alignment relationship between each photosensitive pixel 3521 and each active display pixel 3220 is uniform. Therefore, the transmitted optical signals received by each photosensitive pixel 3521 can be uniform.

In other embodiments, two or more display pixels (i.e., active display pixels) may correspond to one photosensitive pixel. In a macroscopic view, an alignment relationship between each photosensitive pixel and the two or more display pixels may be uniform. Therefore, it can be ensured that the transmitted optical signals received by each photosensitive pixel are uniform.

In some embodiments, colors of light emitted by the active display pixels 3220 may be white, violet, blue, cyan, green, yellow, orange, red, or near-infrared light. In other embodiments, each active display pixel may include three sub pixels, i.e., a red sub-pixel, a green sub-pixel and a blue sub-pixel respectively.

Referring to FIG. 5, in some embodiments, a light collimation layer 330 may be disposed between the OLED display layer and the optical fingerprint sensing layer. The light collimation layer 330 may at least partially absorb oblique light transmitting from the first substrate to the optical fingerprint sensing layer, allowing light at a vertical angle or at a nearly vertical angle (a maximum difference between the nearly vertical angle and the vertical angel may be less than 10 degrees) to pass through the light collimated layer 330 and to enter the photosensitive pixels 3521 of the optical fingerprint sensing layer.

In some embodiments, the light collimation layer 330 may include a non-opaque region 331 and a light-blocking region 332. Since the non-opaque region 331 is an elongated region, and the light-blocking region 332 surrounds the non-opaque region 331, when the light collimation layer 330 absorbs a large amount of oblique incident light, only vertical light or near-vertical light (an angle difference between the vertical light and the near-vertical light may be less than 10 degrees) is allow to pass through the light collimation layer 330, so that a light collimation effect can be achieved.

In some embodiments, the light collimation layer 330 may have a single layer structure. In other embodiments, the light collimation layer 330 may have a multilayer structure.

Referring to FIG. 5, in some embodiments, the display module may further include a sealing frame 340 disposed between the first substrate 310 and the optical fingerprint sensor 350. The sealing frame 340 may be a plastic frame or be made of a combination of other rigid frame materials and glue.

In some embodiments, the sealing frame 340 is sealed around the self-luminous display layer 320 between the first substrate 310 and the optical fingerprint sensor 350. It is not shown in FIG. 5 whether or not the sealing frame 340 seals the optical fingerprint sensing layer. Specifically, the sealing frame 340 may seal the optical fingerprint sensing layer between the first substrate 310 and the second substrate 351, or not seal the optical fingerprint sensing layer.

In some embodiments, the OLED display layer and the light collimation layer 330 are directly stacked. FIG. 6 only schematically illustrates a partial structure of the optical fingerprint sensing layer, besides that the optical fingerprint sensing layer may further include a protective film layer (not shown), and the light collimation layer 330 (not shown in FIG. 4) may be directly formed on a surface of the protective film layer on an outermost surface of the optical fingerprint sensing layer.

During a fabrication process of the display module, the OLED display layer may be formed on a lower surface of the first substrate 310, the optical fingerprint sensing layer may be formed on an upper surface of the second substrate 351, the protective film layer may be formed on the optical fingerprint sensing layer, and then the light collimation layer 330 may be formed on a surface of the protective film layer, and finally the first substrate 310 and the second substrate 351 are face to face laminated and bonded to each other, so that the OLED display layer, the light collimation layer 330 and the optical fingerprint sensing layer can be bonded and sealed between the first substrate 310 and the second substrate 351.

In other embodiments, the OLED display layer may be formed on a lower surface of the first substrate 310, the protective film layer may be formed on the OLED display layer, the light collimation layer 330 may be formed on the protective film layer, the optical fingerprint sensing layer may be formed on an upper surface of the second substrate 351, and then the first substrate 310 and the second substrate 351 are face to face laminated to each other, so that the OLED display layer, the light collimation layer 330 and the optical fingerprint sensing layer can be laminated and sealed between the first substrate 310 and the second substrate 351.

In some embodiments, in the condition that the light collimation layer 330 is disposed between the OLED display layer and the optical fingerprint sensing layer, a distance between the photosensitive pixels 3521 and a first surface is set as less than 5 mm. Then a thickness of the first substrate 310 may be selected in a relatively larger range.

In the display module according to embodiments of the present disclosure, when the display module performs fingerprint imaging, the self-luminous display layer 320 may function as a light source for providing the light required during the fingerprint imaging.

In the present disclosure, a substrate under a conventional OLED display module is directly replaced with an optical fingerprint sensor 350, so that display function of the OLED can be integrated with the fingerprint imaging function. Using the whole optical fingerprint sensor 350 as a substrate makes it possible for the two functions that were previously difficult to be integrated together cooperate well with each other to form a more desirable structure.

In the present disclosure, the OLED display layer and the optical fingerprint sensor 350 are arranged together, so that the light emitting from the OLED display layer can be used for the optical fingerprint sensor 350 to capture fingerprint images, therefore it is not necessary to additionally configure a light source for the optical fingerprint sensor 350, thereby saving cost and simplifying structure. In addition, the display pixels in the OLED display layer are divided into the non-opaque region 321 and the light-blocked region, so as to ensure that the OLED display layer can display information well, and also to ensure that the optical fingerprint sensor 350 can collect fingerprint well. Therefore, the fingerprint imaging function and the information display function can be integrated together in the entire display module, and application range of the display module can be expanded.

That is, in the present embodiment, the optical fingerprint sensor 350 and the OLED display layer are arranged together by virtue of characteristic properties of the OLED display layer (e.g., having a certain light transmittance) and properties of the optical fingerprint sensor 350, and functions of the OLED display layer and functions of the optical fingerprint sensor 350 may be combined through a mutual cooperation of the optical fingerprint sensor 350 and the OLED display layer in use, so that the entire display module can not only have an information display function but also have a fingerprint imaging function.

In addition, upper positions of the active display pixels 3220 in the OLED display layer may correspond to lower positions of the photosensitive pixels 3521 in the optical fingerprint sensor 350, so as to better ensure that light of the OLED display layer can reach the optical fingerprint sensor 350 more uniformly, and further to ensure that fingerprint imaging function of the entire display module can be still maintained at a high level.

The display module provided according to embodiments of the present disclosure may be assembled in an electronic product such as a mobile phone and so on. In some embodiments, the entire display module may be assembled in a phone shell, and a protective cover plate (a protective layer) may be disposed in positions corresponding to the first substrate 310, and a surface of the protective cover plate may be a contact interface of a fingerprint. In some embodiments, the first substrate 310 may be directly used as a contact interface of a fingerprint. In such an electronic product, an optical phenomenon such as reflection and refraction and so on may occur when light emitting from the self-luminous display layer 320 reaches an interface between a finger's epidermis and a corresponding substrate (i.e., the first substrate 310, or the protective cover plate). Thereafter, the reflected light at least partially returns to the first non-opaque substrate and can pass through the self-luminous display layer 320 via the non-opaque region 321, so as to enter the photosensitive pixels 3521 of the optical fingerprint sensing layer and to be received by the photosensitive pixels 3521.

In some embodiments, a light collimation layer 330 is disposed between the optical fingerprint sensor 350 and the OLED display layer (i.e., self-luminous display layer 320), so that the light emitted by the OLED display layer can transmit upward or obliquely upward and can be applied to fingerprint collection, and then only light at a vertical angle or light at a nearly vertical angle can enter the optical fingerprint sensing layer of the optical fingerprint sensor 350 so as to be received by the photosensitive pixels 3521. On one hand, the captured fingerprint images may be clearer, on the other hand, thickness of layers stacked above the OLED display layer including the first substrate 310 or other substrates may be selected in a greater range, and mechanical strength of a particular substrate can be increased accordingly.

With continued reference to FIG. 5, the first substrate 310 has a first surface (not labeled) and a second surface (not labeled), where the first surface of the first substrate 310 is away from the second substrate 351, and the second surface of the first substrate 310 is disposed face to face to the second substrate 351. As shown in FIG. 5, a touch-sensitive layer 360 is disposed on the second surface.

It should be noted that, in other embodiments, the touch-sensitive layer 360 may be disposed on the first surface or the touch-sensitive layer 360 may be disposed on both the first surface and the second surface.

Figure 7:
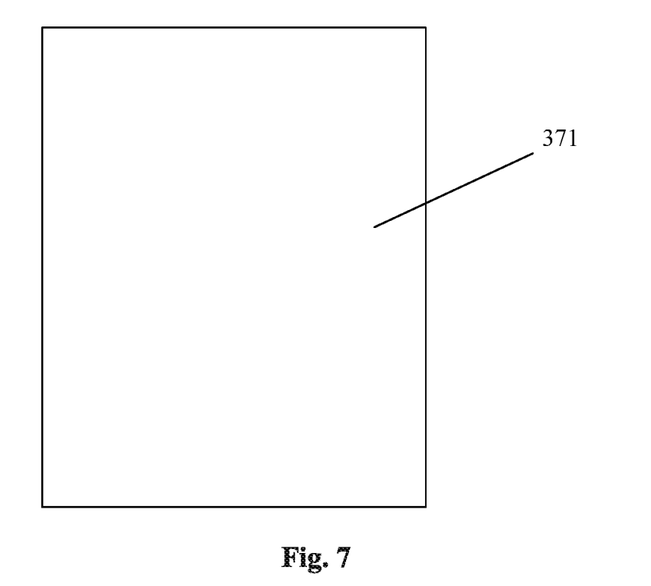
FIGS. 7 to 9 schematically illustrate top views of a self-luminous display layer, a touch sensing layer and an optical fingerprint sensing layer in different conditions.

In the condition that the touch sensing layer 360 is disposed, a top view of the self-luminous display layer 320, a top view of the optical fingerprint sensing layer, and a top view of the touch sensing layer 360 may be overlapped, and the overlapped top view is shown as a rectangle 371 in FIG. 7. In other embodiments, the overlapped top view may be in other shapes.

In the condition of the top view shown in FIG. 7, any of the following two methods for fingerprint signal imaging may be employed in the present embodiment: in a first method, light signals are captured over an entire region of the optical fingerprint sensing layer; and in a second method, the light signals are only captured in a first region, where the first region may refer to a region where the sensing layer 360 senses a finger pressing.

In the second method described above, the fingerprint signal may be collected in the region where the finger actually presses, instead of being collected in the entire region of the optical fingerprint sensing layer, thereby reducing the imaging time and improving the imaging speed.

In the second method described above, an area of the self-luminous display layer 320 where the touch sensing layer 360 senses finger pressing is the first region, and the optical fingerprint sensing layer only captures light that can transmit from the first region into the optical fingerprint sensing layer.

It should be noted that, in other embodiments, a top view of the self-luminous display layer 320 and a top view of the touch sensing layer 360 may be overlapped, while a top view of the optical fingerprint sensing layer may be smaller than a top view of the self-luminous display layer 320, and the top view of the optical fingerprint sensing layer may be located within the top view of the self-luminous display layer 320. Specifically, the overlapped top view of the self-luminous display layer 320 and the touch sensing layer 360 may be shown as a rectangle 381 in FIG. 8, and the top view of the optical fingerprint sensing layer may be shown as a rectangle 382 in FIG. 8.

Figure 8:
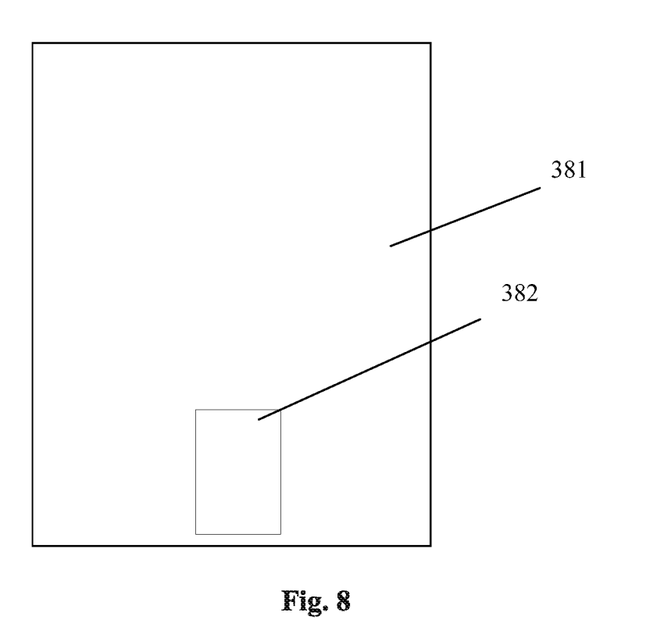

In the condition as shown in FIG. 8, any of the following two methods for fingerprint signal imaging may be employed: in a first method, light signals are collected in an entire region of the optical fingerprint sensing layer; and in a second method, the touch sensing layer 360 senses a region of the self-luminous display layer 320 which is pressed by a finger, if the region is within an effective region 382 of the optical fingerprint sensing layer, the region that is pressed by a finger is defined as a second region and light signals are only collected in the second region.

In the second method described above, the fingerprint signal may be captured in the region where the finger actually presses instead of being collected in the effective region 382 of the optical fingerprint sensing layer, thereby reducing the imaging time and improving the imaging speed.

In the second method described above, an area of the self-luminous display layer 320 where the touch sensing layer 360 senses finger pressing is the second region and the optical fingerprint sensing layer only collects light entering the optical fingerprint sensing layer from the second region. If there is no light entering the optical fingerprint sensing layer from the second region, then occurrence of a case that no fingerprint image is captured may be allowed.

Figure 9:
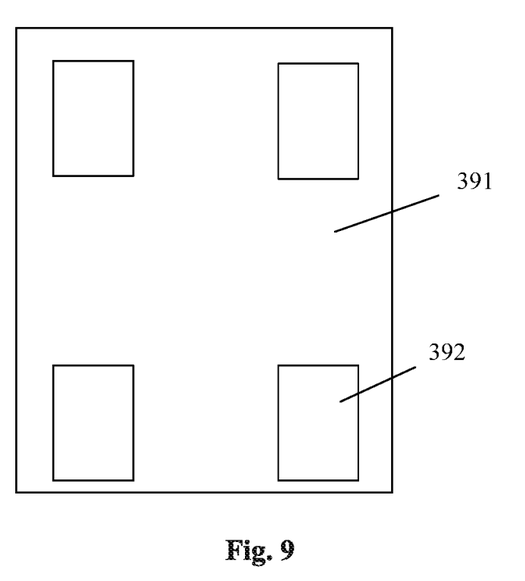

It should be noted that, in other embodiments, the top view of the self-luminous display layer 320 and the top view of the touch sensing layer 360 may be overlapped, and the top view of the optical fingerprint sensing layer may include a plurality of sub-regions, each of the plurality of sub-regions is located within the top view of the self-luminous display layer 320. As shown in FIG. 9, in some embodiments, the top view of the optical fingerprint sensing layer may include four sub-regions. In other embodiments, the top view of the optical fingerprint sensing layer may include other number of sub-regions that are more than two sub-regions. The overlapped top view of the self-luminous display layer 320 and the touch sensing layer 360 is shown as a rectangle 391 in FIG. 9, and the top view of the optical fingerprint sensing layer is shown as a rectangle 392 in FIG. 9.

In the embodiments shown in FIG. 9, any of the following two fingerprint signal imaging methods may be employed: in a first method, light signals are captured in all effective regions 392 of the optical fingerprint sensing layer; and in a second method, the touch sensing layer 360 senses a region of the self-luminous display layer 320 which is pressed by a finger, if the region is within the effective regions 392 of the optical fingerprint sensing layer, the region that is pressed by a finger is defined as a third region and light signals are collected only in the third region.

In the second method described above, fingerprint signals may be collected in the region which is pressed by a finger instead of being collected in all the effective areas 392 of the optical fingerprint sensing layer, thereby reducing the imaging time and improving the imaging speed.

In the second method described above, an area of the self-luminous display layer 320 where the touch sensing layer 360 senses finger pressing is the third region and the optical fingerprint sensing layer only collects light entering the optical fingerprint sensing layer from the third region. If there is no light entering the optical fingerprint sensing layer from the third region, then a case that no fingerprint image is captured may be appeared.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

What is claimed is:

1. A display module comprising:
   a first substrate and a second substrate disposed face to face, where the first substrate is a non-opaque substrate; and
   a self-luminous display layer disposed between the first substrate and the second substrate, where the self-luminous display layer comprises display pixels, each of the display pixels comprises a light emitting device, and the light emitting device comprises a self-luminous layer;
   wherein the display module further comprises:
   an optical fingerprint sensing layer disposed between the self-luminous display layer and the second substrate, where the optical fingerprint sensing layer has a photosensitive pixel region and the photosensitive pixel region comprises a plurality of photosensitive pixels;
   the self-luminous display layer has a non-opaque region, at least a portion of light transmitting from the first substrate to the self-luminous display layer can pass through the self-luminous display layer via the non-opaque region, and reach the optical fingerprint sensing layer; and
   the self-luminous display layer has a light-blocked region located between the self-luminous layer and the optical fingerprint sensing layer, and the light-blocked region is configured to prevent light emitting from the self-luminous layer from reaching the optical fingerprint sensing layer before entering the first substrate;
   wherein the self-luminous display layer is an OLED display layer;
   wherein the OLED display layer and the optical fingerprint sensing layer are directly laminated.

2. The display module according to claim 1, wherein a first surface of the first substrate is away from the second substrate and a distance between the plurality of photosensitive pixels and the first surface is less than 0.5 mm.

3. The display module according to claim 1, wherein a first surface of the first substrate is away from the second substrate and a distance between the plurality of photosensitive pixels and the first surface is less than 5 mm.

4. The display module according to claim 1, wherein the display pixels are isolated display pixels, the light emitting device comprises a first electrode and a second electrode, the first electrode is a common electrode, first electrodes of all the display pixels are connected together, second electrodes of all the display pixel are isolated, and the second electrode is made of a light-blocked conductive material, and the light-blocked region comprises an area where the second electrode is located.

5. The display module according to claim 4, wherein one or more isolated display pixels correspond to one of the plurality of photosensitive pixels; and an area of each isolated display pixel is equal to an area of each photosensitive pixel, when each of the isolated display pixels corresponds to each of the plurality of photosensitive pixels.

6. The display module according to claim 5, wherein colors of light emitted by the isolated display pixels are white, violet, blue, cyan, green, yellow, orange, red, or near-infrared light; or the isolated display pixels comprise three sub pixels, and the three sub pixels are a red sub pixel, a green sub pixel, and a blue sub pixel respectively.

7. The display module according to claim 1, wherein the display pixels are passive display pixels arranged in an array, the light emitting device comprises a first electrode connected with a data line in a first axial direction, and a second electrode connected with a scan line in a second axial direction, the second electrode is made of a light-blocked conductive material, and the light-blocked region comprises a region where the second electrode is located.

8. The display module according to claim 1, wherein the display pixels are active display pixels arranged in an array, the light emitting device comprises a first electrode and a second electrode, each of the active display pixels is connected with a data line and a scanning line, the first electrode is a common electrode, first electrodes of all the display pixels are connected together, the second electrode is made of a light-blocked conductive material, and the light-blocked region comprises a region where the second electrode is located.

9. The display module according to claim 8, wherein each of the active display pixels comprises an element region, a light emitting device region and a surrounding region, the element region and the light emitting device region are a portion of the light-blocked region, and the surrounding region is a portion of the non-opaque region.

10. The display module according to claim 1, wherein when the display module is performing fingerprint imaging, the self-luminous display layer serves as a light source for providing light required during the fingerprint imaging.

11. The display module according to claim 1, wherein a first surface of the first substrate is away from the second substrate, a second surface of the first substrate is near the second substrate, and a touch sensing layer is disposed on at least one of the first surface and the second surface.

12. The display module according to claim 11, wherein a top view of the self-luminous display layer, a top view of the optical fingerprint sensing layer and a top view of the touch sensing layer are overlapped.

13. The display module according to claim 12, wherein light signals are collected in an entire area of the optical fingerprint sensing layer; or the light signals are collected only in a first region, where the first region corresponds to a region of the self-luminous display layer where the touch sensing layer senses a finger pressing.

14. The display module according to claim 11, wherein a top view of the self-luminous display layer is overlapped with a top view of the touch sensing layer, an area of a top view of the optical fingerprint sensing layer is smaller than an area of a top view of the self-luminous display layer, and the top view of the optical fingerprint sensing layer is located within the top view of the self-luminous display layer.

15. The display module according to claim 14, wherein light signals are collected in an entire area of the optical fingerprint sensing layer; or the light signals are collected only in a second region, where the second region corresponds to a region of the self-luminous display layer where the touch sensing layer senses a finger pressing.

16. The display module according to claim 11, wherein a top view of the self-luminous display layer and a top view of the touch sensing layer are overlapped, a top view of the optical fingerprint sensing layer comprises a plurality of sub-regions, and each of the plurality of sub-regions is located within the top view of the self-luminous display layer.

17. The display module according to claim 16, wherein light signals are collected in an entire area of the optical fingerprint sensing layer; or the light signals are collected only in a third region, where the third region corresponds to a region of the self-luminous display layer where the touch sensing layer senses a finger pressing.

* * * * *